United States Patent [19]

Bradshaw et al.

[11] Patent Number: 4,633,221

[45] Date of Patent: Dec. 30, 1986

[54] DUAL SLOPE ANALOG-TO-DIGITAL CONVERTER WITH AUTOMATIC, SHORT CYCLE RANGE DETERMINATION

[75] Inventors: Peter D. Bradshaw, Sunnyvale; Lee L. Evans, Atherton, both of Calif.

[73] Assignee: Intersil, Inc., Cupertino, Calif.

[21] Appl. No.: 786,175

[22] Filed: Oct. 9, 1985

Related U.S. Application Data

[63] Continuation of Ser. No. 544,572, Oct. 24, 1983, abandoned.

[51] Int. Cl.⁴ .............................................. H03M 1/18
[52] U.S. Cl. ............................... 340/347 NT; 324/990
[58] Field of Search ............... 340/347 NT; 324/990, 324/115, 130; 364/483; 328/127

[56] References Cited

U.S. PATENT DOCUMENTS

| | | | |
|---|---|---|---|
| 3,840,807 | 10/1974 | Zschimmer | 340/347 NT X |
| 3,958,178 | 5/1976 | Mueller et al. | 324/990 X |
| 3,978,471 | 8/1976 | Kelly | 340/347 NT |
| 4,217,542 | 8/1980 | Abbe et al. | 324/130 X |
| 4,243,975 | 1/1981 | Masuda et al. | 340/347 NT |
| 4,395,701 | 7/1983 | Evans | 324/99 D |

Primary Examiner—A. D. Pellinen
Assistant Examiner—Derek S. Jennings
Attorney, Agent, or Firm—Spensley Horn Jubas & Lubitz

[57] ABSTRACT

A dual slope analog-to-digital converter with automatic short cycle range determination. The time period of the signal integrate phase is adjusted to accommodate different ranges of input signals. Range selection is achieved automatically with the converter switching quickly from one range to another until the right range is found, without the necessity of displaying an "out of range" reading. Normal mode rejection of 60 Hz noise is achieved on all timing ranges.

7 Claims, 3 Drawing Figures

DUAL SLOPE ANALOG-TO-DIGITAL CONVERTER WITH AUTOMATIC, SHORT CYCLE RANGE DETERMINATION

This application is a continuation of Ser. No. 544,572, filed Oct. 24, 1983, now abandoned.

BACKGROUND OF THE INVENTION

1. Field of the Invention

The present invention relates to a dual slope analog-to-digital converter with automatic, short cycle range determination and, more particularly, to a simple and inexpensive dual slope analog-to-digital converter having a minimum number of components.

2. Description of the Prior Art

Integrating analog-to-digital converters have two characteristics in common. First, their output represents the integral or average of an input voltage over a fixed period of time. Thus, an integrating converter will give repeatable results in the presence of high frequency (relative to the measurement period) noise. Secondly, they use time to quantize the answer resulting in extremely small non-linearity errors and no possibility of missing output codes. Furthermore, the integrating analog-to-digital converter has very good rejection of frequencies whose periods are an integral multiple of the measurement period. This feature can be used to advantage in reducing line frequency noise. The unique characteristics of the integrating converter have made it the natural choice for panel meters and digital voltmeter applications.

The most popular integrating converter is the "dual slope" type. In such a converter, conversion takes place in three distinct phases. The first phase is an autozero phase during which the errors in the analog components will be automatically nulled out by grounding the input and closing a feedback loop such that error information is stored on an auto-zero capacitor.

The second phase is the signal integrate phase during which an integrator capacitor is charged with an unknown current, proportional to an unknown voltage $V_{IN}$, for a fixed period of time, typically for a fixed number of clock pulses. For a 3½ digit converter, 1,000 pulses is the usual count. For a 4½ digit converter, 10,000 pulses is typical. On completion of the integration period, the voltage V on the integrator capacitor is directly proportional to the input signal.

The third phase is the deintegrate phase during which the integrator capacitor is discharged with a known current for a variable period of time. More specifically, at the beginning of the deintegrate phase, the integrator input is switched from $V_{IN}$ to a reference voltage $V_{REF}$. The polarity of the reference voltage is determined during the integrate phase such that the capacitor discharges back toward zero. Clock pulses are counted between the beginning of the deintegrate phase and the time when the integrator output passes through zero. The number of clock pulses counted is a digital measure of the magnitude of $V_{IN}$.

The advantage of a dual slope analog-to-digital converter is that the theoretical accuracy depends only on the absolute value of the reference voltage and the equality of the individual clock pulses within a given conversion cycle. The latter can easily be held to one part in $10^6$, so in practical terms, the only critical component is the reference voltage. Changes in the value of other components, such as the integration capacitor or the comparator input offset voltage have no effect, provided they don't change during an individual conversion cycle.

In spite of the above, several problems are encountered when one desires to develop a very inexpensive digital multimeter and one having several ranges of operation. The only way to bring cost down is to replace as many switches as possible and eliminate costly precision components and to more fully integrate. That is, in the past, in order to handle a number of different ranges, a number of resistor-divider networks have been used at the input of a multimeter. These resistor-dividers must be precision resistors, resulting in a high cost and the resistors cannot be included in an integrated circuit.

Another alternative is to change ranges by changing the time during the integrate phase. With such a technique, the instrument can automatically change ranges until the correct range is found. However, all previous autoranging instruments require the full integrate/deintegrate time period to make a measurement and determine whether or not the input is within the desired range. If the instrument is on the wrong scale, it will continue indicating "over range" until it changes to the correct range. This is quite undesirable because it is time consuming and an annoyance to the user of the instrument.

SUMMARY OF THE INVENTION

According to the present invention, these problems are solved by the provision of a novel, dual slope analog-to-digital converter. The present analog-to-digital converter has a minimum number of input switches and precision components to provide for more complete integration, resulting in an extremely low cost. The present converter is a multiple range system and the ranges are selected automatically. All one has to do is select current or voltage and AC or DC and the converter does the rest. It will automatically switch from one range to another and will do this quickly until it finds the right range whereupon it determines the value of the input signal and provides a display. With the present technique, one can contact an input and within ½ of a second the right value on the right range is provided without ever indicating "out of range".

Briefly, in a dual slope analog-to-digital converter of the type having an integrate phase during which a capacitor is charged with an unknown current, proportional to an unknown voltage, for a fixed period of time and a deintegrate phase during which the capacitor is discharged with a known current for a variable period of time, the unknown voltage being directly proportional to the variable period of time, and means for measuring the variable period of time, there is disclosed an improvement comprising (a) establishing a plurality of timing ranges, each differing from at least one other by one order of magnitude; (b) using the shortest timing range as the fixed period of time during a first integrate phase; (c) determining, at the end of a first deintegrate phase, whether the variable period of time is greater or less than a predetermined minimum period of time; (d) using the next longer timing range as the fixed period of time during a seocnd integrate phase if the variable period of time at the end of the first deintegrate phase is less than the predetermined minimum period of time; (e) determining, at the end of a second deintegrate phase, whether the variable period of time is greater or less than the predetermined minimum period of time; and (f)

repeating steps (d)–(e) for each of the timing ranges until the variable period of time, at the end of a deintegrate phase, is greater than the predetermined minimum period of time or the converter reaches the last range; and (g) indicating the value of the unknown voltage from the measured variable period of time when it is greater than the predetermined minimum period of time.

OBJECTS, FEATURES AND ADVANTAGES

It is therefore the object of the present invention to solve the problems encountered heretofore in providing an auto ranging dual slope analog-to-digital converter. It is a feature of the present invention to solve these problems by providing a dual slope analog-to-digital converter which performs a short cycle determination until it finds the right range and then uses the complete cycle to display an output. An advantage to be derived is a converter having a minimum number of switches and precision components. A further advantage is a converter which is more fully integrated. Another advantage is a converter having a very low cost. Another advantage is a converter which can provide a measurement within $\frac{1}{3}$ of a second. Still another advantage is a converter which does not normally indicate "out of range" while searching for the correct range.

Still other objects, features, and attendant advantages of the present invention will become apparent to those skilled in the arm from a reading of the following detailed description of the preferred embodiment constructed in accordance therewith, taken in conjunction with the accompanying drawings wherein:

DESCRIPTION OF THE PREFERRED EMBODIMENT

Figure 1:
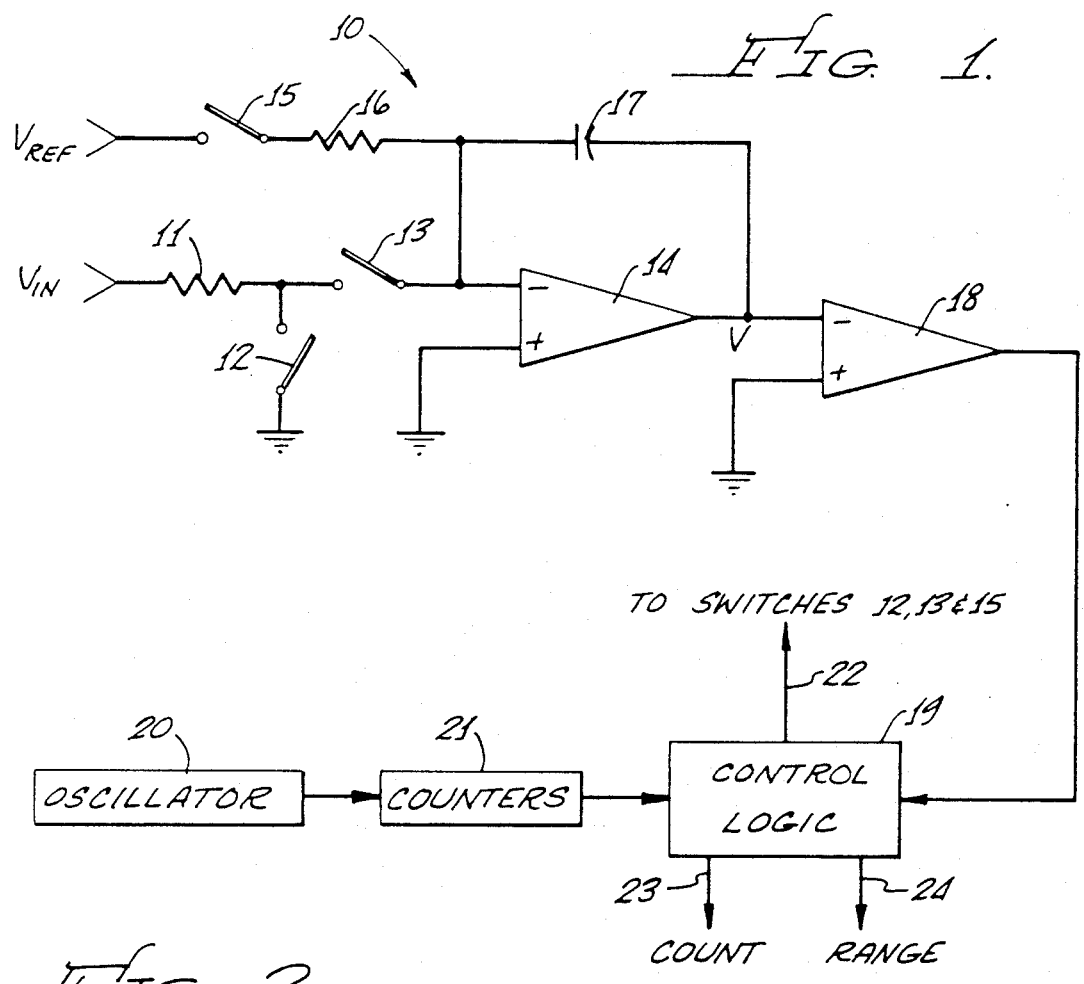
FIG. 1 is a block diagram of a dual slope analog-to-digital converter with short cycle, automatic range determination according to the present invention.

Referring now to the drawings and, more particularly, to FIG. 1 thereof, there is shown a dual slope analog-to-digital converter, generally designated 10, suitable for implementing the present invention. Converter 10 has two inputs $V_{REF}$ and $V_{IN}$. $V_{IN}$, the unknown input, is applied to one end of a first resistor 11, the other end of which is connected via a first switch 12 to ground and via a second switch 13 to the negative input of an integrator 14, the positive input being connected to ground. $V_{REF}$, the reference voltage, is connected via a third switch 15 and a second resistor 16 to the negative input of integrator 14. An integrator capacitor 17 is connected between the output and the negative input of integrator 14. The output of integrator 14, voltage V, is connected to one input of a comparator 18, the other input being connected to ground. The output of comparator 18 is connected to suitable control logic circuitry 19.

An oscillator 20 provides a stable and constant frequency to counters 21 which are constantly counting the output of oscillator 20. The outputs of counters 21 are applied to control logic 19. Control logic 19 performs the necessary calculations, to be described more fully hereinafter, and controls the opening and closing of switches 12, 13 and 15 via signals over line 22. Control logic 19 also indicates the digital value of the count when a correct count is reached and the range on lines 23 and 24, respectively. This information can be sent to a microprocessor or to a display. Elements 19–21 could be an 8048 microprocessor.

Converter 10 is similar to other dual slope convertors in that by manipulation of switches 12, 13 and 15, three phases can be realized (autozero, integrate and deintegrate). During the autozero phase, both of switches 12 and 13 are closed and switch 15 is open. This grounds the input to integrator 14 and closes the feedback loop such that error information is stored on capacitor 17 and an autozero capacitor (not shown). For the purposes of this invention, this phase is unimportant except in the fact that errors due to offset voltages of integrator 14 and comparator 18 are stored and subtracted from the input voltage ($V_{IN}$ or $V_{REF}$).

Figure 2:
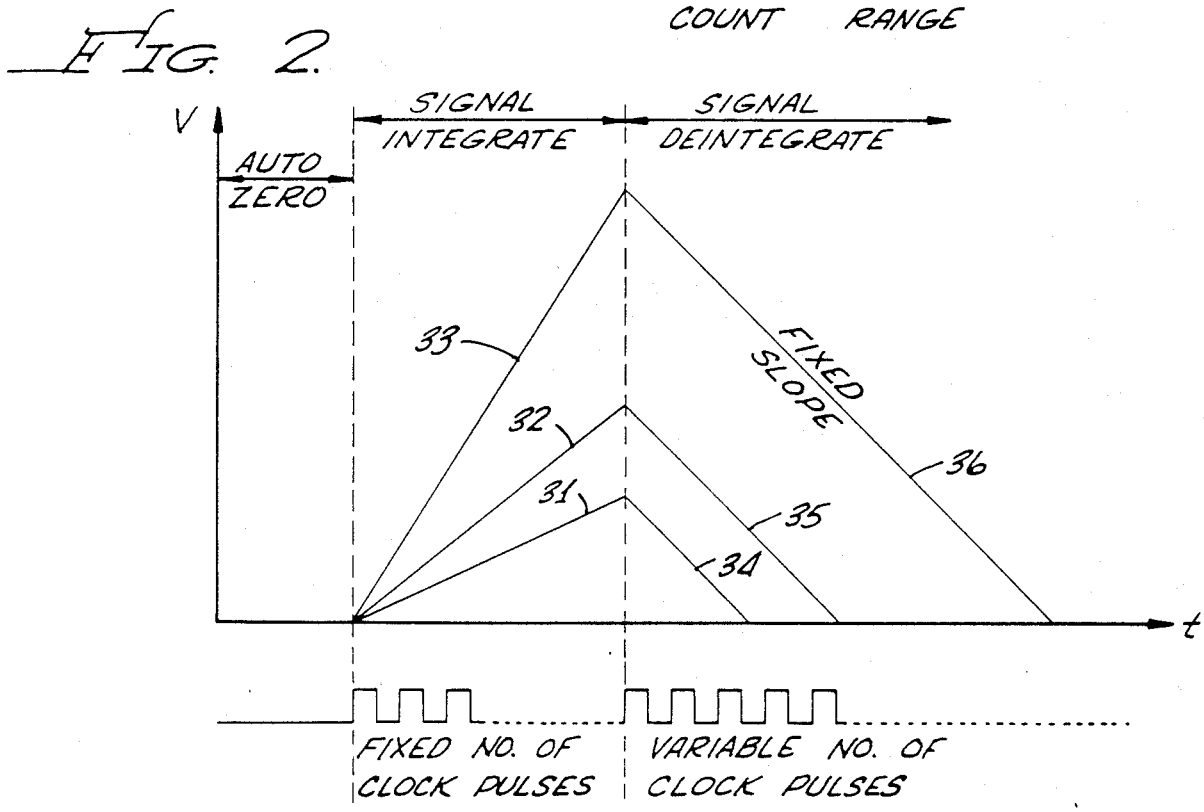
FIG. 2 is a graph of voltage V across the integrating capacitor as a function of time t.

During the integrate phase, switches 12 and 15 are open and switch 13 is closed. During this phase, capacitor 17 is charged with a current through resistor 11 for a fixed period of time. Control logic 19 controls the opening and closing of switches 12, 13 and 15 and performs the control function by decoding pulses from counters 21. At the end of the integrate phase, the voltage V at the output of integrator 14 will be directly proportional to $V_{IN}$. FIG. 2 shows that the charging of capacitor 17 may follow curve 31, 32 or 33, or any other curve, depending on the value of $V_{IN}$. Also as shown in FIG. 2, charging of capacitor 17 proceeds for a fixed number of clock pulses.

At the conclusion of the integrate phase, comparator 18 senses the sign of the voltage at node V. The polarity of $V_{IN}$ is now known.

During the deintegrate phase, switches 12 and 15 are closed and switch 13 is open. During this phase, the reference voltage $V_{REF}$ of opposite polarity to $V_{IN}$ is applied to the input of integrator 14 through resistor 16 and switch 15. This reference voltage is applied until the voltage V is forced to ground (this is termed as zero crossing). As seen in FIG. 2, the discharging of capacitor 17 will follow a curve having a fixed slope, as shown by curves 34, 35 and 36. Clock pulses are counted between the beginning of the deintegrate phase and the time when the output of integrator 14 passes through zero. The number of clock pulses counted is a digital measure of the magnitude of $V_{IN}$. Control logic 19 provides an output on line 23 indicative of the number of clock pulses counted from counters 21 during the deintegrate phase.

It is the desire of the present invention to not only determine the value of $V_{IN}$, but to also determine that value regardless of the range that it is on and to determine the range automatically. That is, assume for the moment that the maximum number of clock pulses during the signal deintegrate phase is 2,000 and that the maximum input voltage is 2 volts. That would mean that one could read from 1 millivolt to 2 volts with one millivolt accuracy and 1 millivolt resolution. Suppose now the input voltage is 100 microvolts. It is evident that at the end of the counting period, there would be an insufficient voltage at the output of integrator 14 to produce an output. To produce an output, one could add another decade of counters to count for a much longer period of time, but that would mean incorporating much more detailed circuitry to enable comparator 18 to handle the extra decade of accuracy.

What about the situation where instead of wanting to read 2 volts, $V_{IN}$ is 20 volts? In the past, this has typically been handled by providing a voltage divider at the input to converter 10, so that converter 10 would only see a 2 volt equivalent input voltage, and by adjusting any decimal points in the display. However, this would require precision resistors and a switch. In order to read 200 volts or 2,000 volts, one could continue adding additional resistor dividers and additional switches. All of this is expensive.

According to the present invention, these problems are solved by adjusting the time period of the signal integrate phase. The concept of the present invention can best be described using an example. According to the preferred embodiment of the invention, converter 10 has four different ranges, all of which have the same peak voltage V, the ranges being defined by 10, 100, 1,000 and 10,000 clock pulses during the integrate phase. Because one can divide time-wise very easily with high accuracy, this is an ideal method of changing ranges. Furthermore, using the method of the present invention, the ranges can be changed rapidly until the proper range is found. The method implemented by converter 10 may be best understood with reference to FIG. 3.

Figure 3:
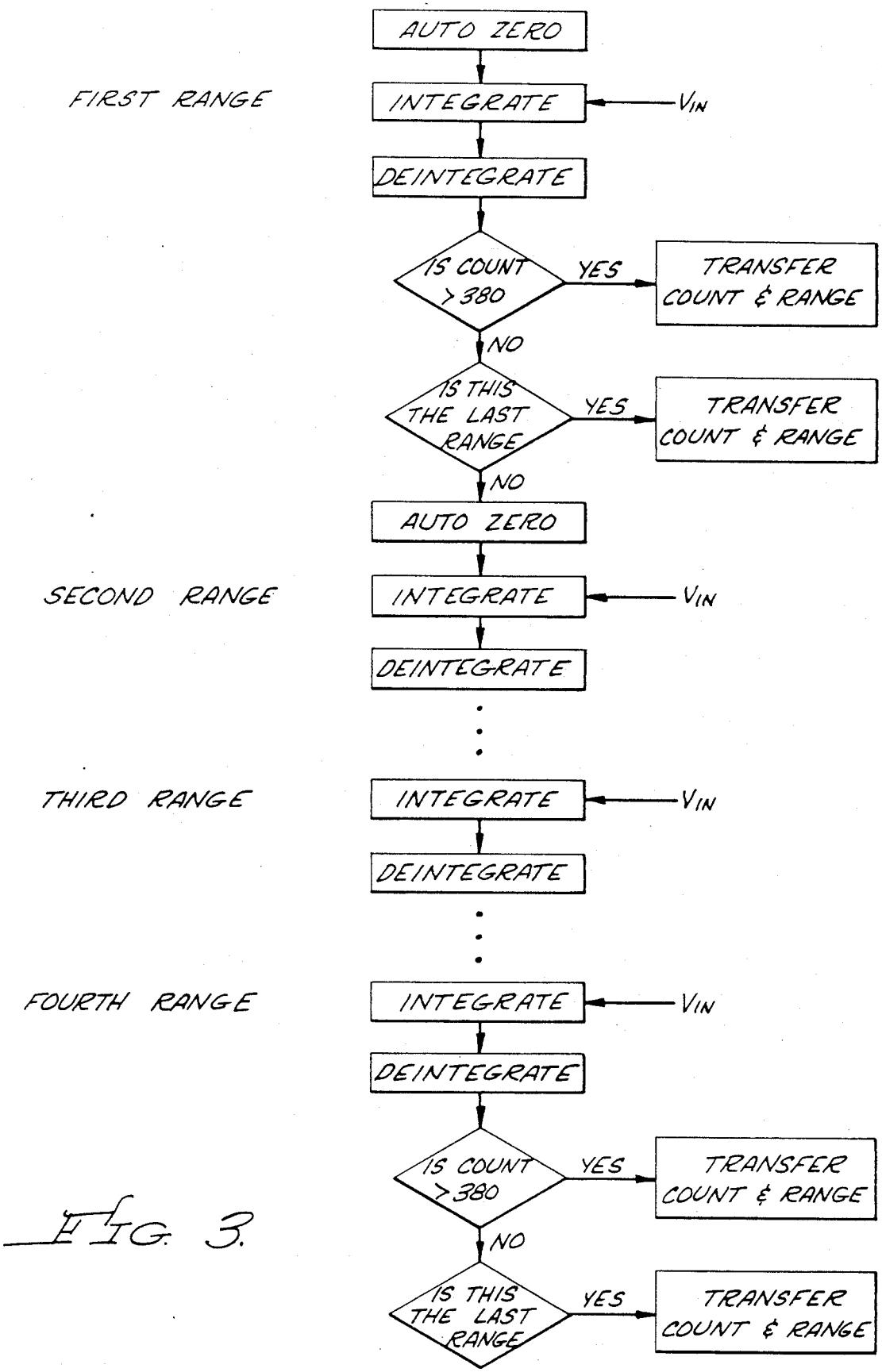
FIG. 3 is a flow diagram showing the operation of the converter of FIG. 1.

Assume for the moment that it takes 4,000 counts during the deintegrate phase to provide a full scale reading of the input voltage. When converter 10 is applied to an input voltage, the above-described auto-zero, integrate and deintegrate process proceeds with 10 clock pulses used as the fixed number of clock pulses during the signal integrate phase. At the conclusion of the integrate phase, deintegration proceeds at the known rate until a zero crossing is reached. Ten percent of a full scale reading, using this example, would be 400 counts. If the number of counts is less than 400, one would immediately know that if switched to the second range, and that range permitted counting for ten times longer during the signal integrate phase, the output would be closer to a full scale reading. In order to prevent inaccuracies, a percentage slightly less than ten percent is selected. As shown in FIG. 3, therefore, at the end of the first deintegrate phase, control logic 19 determines whether the count between the beginning of the deintegrate phase and the zero crossing is greater than 380 counts. If yes, control logic determines that the voltage is high enough that a sufficient reading has been obtained and the count and range are transmitted over lines 23 and 24, respectively, to a suitable microprocessor or display.

On the other hand, if the count is not greater than 380 counts and this is not the last range, control logic 19 signals switches 12, 13 and 15 to repeat the sequence and now the signal integrate phase proceeds for 100 counts. At the end of the signal deintegrate phase, control logic again determines whether the count at the output of comparator 18 is greater than 380 counts. If it is, the count and range are transferred. If it is not and this is not the last range, switches 12, 13 and 15 are immediately signaled to start over again. This procedure continues for the four ranges until 10,000 clock pulses are counted during the signal integrate phase. If, at the end of the deintegrate phase, the count is greater than 380, the count and range are transferred. If it is not, the count and range are transferred anyway. The display does not display anything until the right range is found or the instrument runs out of ranges.

According to the preferred embodiment of the invention, a still further feature is incorporated in converter 10. That is, although the unknown input voltage is assumed to be a DC voltage, realistically there is always noise and/or AC interference superimposed on the wanted DC voltage. Therefore, $V_{IN}(t)$ (the input voltage as a function of the time) can, in general, be represented by $V_{IN}$+ noise, where noise is a frequency dependent, unwanted signal. The most common AC signal which is superimposed on the DC signal as noise is the 60 Hz line frequency.

Accordingly, it is preferred that the frequency of the clock pulses during the signal integrate phase be selected so that 1,000 clock pulses occur during one complete cycle of a 60 Hz signal, i.e. 60 kHz. Obviously, the frequency can be selected to correspond to any other frequency to be cancelled. Thus, when the selected range is the 1,000 clock pulses range, signal integration occurs for a complete cycle of a 60 Hz signal. In this way, if there is some AC signal superimposed on the DC signal, it will automatically cancel out. Such a technique provides converter 10 with very high quality, normal mode rejection.

Using such a technique, one automatically achieves normal mode rejection for the 1,000 count and 10,000 count range. It is obvious, however, that this does not automatically occur when counting on the 10 count or 100 count ranges. In order to achieve normal mode rejection in the first two ranges, converter 10 does not integrate continuously during the integrate phase. More specifically, during the first range, when only 10 clock pulses are counted, what control logic 19 does is to signal switch 13 to close for the duration of 1 clock pulse every 100 clock pulses. By using such a technique, the signal integration occurs for the entire 1,000 clock pulse period. In between times, namely for the 99 clock pulses between each 100 clock pulses, converter 10 simply does nothing. This permits converter 10 to achieve normal mode rejection.

When converter 10 switches over to the second range in which 100 clock pulses are counted, control logic 19 signals switch 13 over line 22 to close for the duration of 10 clock pulse for every 100 clock pulses. For the remaining 90 clock pulses between each 100 clock pulses, converter 100 simply does nothing. Obviously, when the third range is reached, every clock pulse is counted and the same occurs in the fourth range where 10,000 clock pulses are counted (10 complete cycles of a 60 Hz signal).

It can therefore be seen that according to the present invention, the problems encountered heretofore are solved by the provision of a novel, dual slope analog-to-digital converter. Converter 10 has a minimum number of input switches and precision components to provide for more complete integration, resulting in an extremely low cost. Converter 10 is a multiple range system and the ranges are selected automatically. All one has to do is to select current or voltage and AC and DC and converter 10 does the rest. It will automatically switch from one range to another and will do this quickly until it finds the right range whereupon it determines the value of the input signal and provides a display. With converter 10, one can contact an input and within ⅓ of a second the right value on the right range is provided without ever indicating "out of range" while the range is searched for.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

We claim:

1. In a dual slope analog-to-digital converter of the type having an overall conversion cycle which includes an integrate phase during which a capacitor is charged with an unknown current, proportional to an unknown voltage, for a fixed period of time, a deintegrate phase where said capacitor is discharged with a known current for a variable period of time, said unknown voltage being directly proportional to said variable period of time, and an output phase in which a digital output value corresponding to said unknown voltage is output by said converter, and said converter further having means for measuring said variable period of time, a method for determining said unknown voltage comprising the steps of:
 (a) establishing a plurality of timing ranges, each differing from at least one other by one order of magnitude;
 (b) using the shortest timing range as the fixed period of time during a first integrate phase;
 (c) determining, at the end of a first deintegrate phase, whether said variable period of time is greater or less than a predetermined minimum period of time;
 (d) before the output phase is completed, using the next longer timing range as the fixed period of time during a second integrate phase if said variable period of time at the end of said first deintegrate phase is less than said predetermined minimum period of time;
 (e) determining, at the end of a second deintegrate phase, whether said variable period of time is greater or less than said predetermined minimum period of time; and
 (f) repeating steps (d)–(e) for each of said timing ranges until said variable period of time, at the end of a deintegrate phase, is greater than said predetermined minimum period of time;
 wherein, the shortest timing range resulting in a variable period of time in excess of the predetermined minimum period of time is determined prior to the completion of the overall conversion cycle.

2. The method of claim 1 further comprising the step of:
 (g) indicating the value of the unknown voltage from the measured variable period of time when it is greater than said predetermined minimum period of time.

3. In a dual slope analog to digital converter of the type having an overall conversion cycle which includes a short conversion cycle which includes an integrate phase during which a capacitor is charged with an unknown current, proportional to an unknown voltage, for a fixed period of time, and a deintegrate phase after the integrate phase where said capacitor is discharged with a known current for a variable period of time, said unknown voltage being directly proportional to said variable period of time, said overall conversion cycle further including an output phase in which a digital value corresponding to said unknown voltage is output by said converter, and said converter further having means for measuring said variable period of time, the improvement comprising:
 timing means for timing one of a plurality of selectable fixed periods of time of unequal duration, each of said fixed periods of time defining a selectable timing range for the integrate phase of a conversion cycle;
 comparison means for comparing the measured variable time period of each deintegrate phase to a predetermined minimum period; and
 control means for successively repeating the short conversion cycle for each timing range before the initiation of the output phase and until the measured variable time period exceeds the predetermined minimum period, said control means including means for selecting a timing range for each short conversion cycle so that the next longer timing range is used for each succeeding short conversion cycle.

4. The converter of claim 3 wherein each timing range differs from at least one other timing range by one order of magnitude.

5. The converter of claim 3 wherein each of said timing ranges is defined by fixed number of clock pulses.

6. The converter of claim 5 wherein the timing ranges are defined by 10, 100, 1000 and 10,000 clock pulses.

7. In a dual slope analog to digital converter circuit of the type having a conversion cycle which includes an integrate phase during which the capacitor is charged with an unknown current, proportional to an unknown voltage, for a timing range of a predetermined number of clock pulses, and a deintegrate phase after the integrate phase, where said capacitor is discharged with a known current for a variable number of clock pulses, said unknown voltage being directly proportional to said variable number of clock pulses, an output phase in which a digital output value corresponding to said unknown voltage is output by said converter, and said converter further having means for counting said variable number of clock pulses up to a predetermined maximum number of clock pulses, the improvement comprising:
 timing means for timing one of a plurality of selectable timing ranges of different predetermined numbers of clock pulses wherein the period of one timing range is equal to the period of one cycle of a predetermined frequency signal;
 comparison means for comparing the counted variable number of clock pulses of each deintegrate phase to a predetermined minimum number of clock pulses;
 control means for successively repeating the conversion cycle for each timing range before the initiation of the output phase and until the counted variable number of clock pulses exceeds the predetermined minimum number, said control means including means for selecting a timing range for each conversion cycle so that the next longer timing range is used for each succeeding conversion cycle, and means for spreading the predetermined number of pulses evenly throughout said period of one cycle of said predetermined frequency signal for all timing ranges shorter than said one timing range.

* * * * *